United States Patent

Hertz et al.

[11] Patent Number: 6,025,717
[45] Date of Patent: Feb. 15, 2000

[54] DIAGNOSTIC SIMULATOR FOR MRI

[75] Inventors: David Hertz, Dix Hills; Michael B. Knepper, Lindenhurst, both of N.Y.

[73] Assignee: Fonar Corporation, Melville, N.Y.

[21] Appl. No.: 08/880,721

[22] Filed: Jun. 23, 1997

[51] Int. Cl.[7] .................................................. G01V 3/00
[52] U.S. Cl. ........................ 324/310; 324/307; 324/309
[58] Field of Search ................................... 324/309, 307, 324/310

[56] References Cited

U.S. PATENT DOCUMENTS 4,871,966 10/1989 Smith et al. .
5,519,320 5/1996 Kanayama et al. ..................... 324/309

*Primary Examiner*—Christine K. Oda
*Assistant Examiner*—Tiffany A. Fetzner
*Attorney, Agent, or Firm*—Morgan & Finnegan, LLP

[57] ABSTRACT

A magnetic resonance imaging ("MRI") simulator for evaluating an MRI device comprises sections for being selectively coupled to the corresponding portions of the MRI device. Data representative of a previously imaged object is provided to the portions of the MRI device, for processing. The results of the processing are evaluated to determine whether portions of the MRI device are operating properly. Methods of evaluating an MRI device and an MRI device incorporating such a simulator are also disclosed.

54 Claims, 2 Drawing Sheets

DIAGNOSTIC SIMULATOR FOR MRI

FIELD OF THE INVENTION

This invention relates to the diagnostic testing of a magnetic resonance imaging system. More particularly, this invention relates to an apparatus and method for providing simulated magnetic resonance imaging data signals to a magnetic resonance imaging device for processing so that the MRI device can be evaluated.

BACKGROUND OF THE INVENTION

Magnetic resonance imaging ("MRI") is a highly useful technique for diagnosing abnormalities in biological tissue. Medical MRI scanning requires creation of a substantially constant "primary" magnetic field, which passes through a patient's body. Additional, linear time varying "gradient" magnetic fields are typically superimposed on the primary field, based on the desired scanning sequence. The patient is also exposed to electromagnetic waves in the radio frequency range, which also vary with time in particular patterns. Under the influence of the magnetic fields and the radio waves, certain atomic nuclei within the patient's tissues resonate and emit other radio frequency waves. By known mathematical techniques involving correlation of the magnetic field patterns applied at various times with the radio frequency waves emitted by the patient, it is possible to determine physical conditions at various locations within the patient's body. This information is typically displayed as an image with intensity corresponding to the concentration and/or physical state of certain nuclei of interest. The concentrations or physical states of different substances ordinarily differ for differing kinds of tissues within the body, and also permit the physician to see abnormalities, such as tumors.

A magnetic resonance imaging ("MRI") device is a highly complex, sensitive system. A typical MRI device comprises a magnet with an imaging volume for exposing a patient to a static magnetic field, a gradient coil system for establishing the linear, time varying gradient magnetic fields in three dimensions necessary for a particular scanning sequence and shimming coils for cancelling non-uniformities in the magnetic field. A transmitting coil for transmitting radio frequency pulses to the patient during the scanning sequence and a receiving coil for picking up magnetic resonance imaging data during an actual scan, are provided as well. The same coil can act as both the transmitting and receiving coil. The receiving coil is typically coupled to a variable amplifier, which amplifies the received data to an adequate level for further processing. A frequency down converter is typically provided to shift the amplified signals, which are in a high frequency range, to a lower frequency range suitable for analog-to-digital ("A/D") conversion by an A/D converting array. The A/D converting array is coupled to a digital data processor, which filters and processes the data. The data processor provides the processed data to a computer, which further processes the data for display by an image display system. A controller typically provides synchronization pulses to the major subsystems of the MRI device to coordinate their operations.

Deviations from proper performance can arise in any of these subsystems or components due to component degradation, drift of analog components, environmental fluctuations, magnetic drift, and system or component failure, for example.

Various techniques are known for detecting and diagnosing variations from normal system or component operation. One diagnostic program for evaluating an MRI device developed by Fonar Corporation "Fonar"), assignee of the present invention, is referred to as MSSR, or multi-slice scan reconstruction. In MSSR, digital data representative of raw magnetic resonance imaging data of a phantom object, such as a cube filled with nickel chloride, is calculated. The calculated data is processed by the MRI device and an image derived from the data is displayed. The displayed test image is viewed for errors, such as image artifacts, to identify problems in the display or data processor of the MRI device. Image artifacts indicative of a problem include banding, multiple images or fuzziness, referred to as ghosting.

Another diagnostic program developed and used by Fonar is incorporated into Fonar's ULTIMATE™ scanner. Raw digital image data from an actual scan of a phantom object is loaded into memory and the data is processed for viewing. Again, the data processing and display systems can be evaluated. A fixed frequency can also be injected into the receiver coil and a scan performed. The resulting image should be a distinct dot. Ghosting in the image indicates a temporal instability somewhere in the system.

No known diagnostic system can evaluate all the major systems of an MRI device. In addition, no known diagnostic system can evaluate the timing accuracy of a scanning sequence in an MRI device.

SUMMARY OF THE INVENTION

The present invention provides a magnetic resonance imaging simulator and a method for evaluating a magnetic resonance imaging device ("MRI") wherein the major subsystems of the MRI device are separately evaluated by selectively providing known data representative of a previously imaged object to one or several of the subsystems, and evaluating the MRI device based on its processing of these data. Preferably, the provision of the data to the MRI device is coordinated with an actual imaging sequence to simulate actual data collection and data processing by the MRI device. The simulator may be part of the MRI device or it may be an independent unit. A preferred embodiment of the apparatus and method of the invention comprises a plurality of stages for evaluating a corresponding plurality of systems of the MRI device.

In a preferred method of the present invention, data representative of the previously imaged object is sequentially provided to particular subsystems of the MRI device in a variety of ways. It is provided as digital data directly to the digital data processor of the MRI device and as analog data directly to an analog-to-digital converter of the MRI device. High frequency analog data representative of the previously imaged object is provided to a frequency down converter of the MRI device. High frequency analog data is provided to a variable amplifier of the MRI device, as well. Radio frequency data representative of the previously imaged object is also provided to the receiving coil of the MRI device, either independent of or while an actual MRI scan is being conducted. The method of the present invention may comprise providing data representative of the previously imaged object to fewer than the subsystems included in the preferred embodiment, as well.

In each case, the MRI device processes the data as it would process data during an actual MRI scan. Portions of the MRI device can then be evaluated based on their processing of the data. Errors in operation can be isolated to the particular subsystem involved in the processing of the provided data.

The MRI simulator of the present invention comprises means for providing the data representative of the previously imaged object in the proper form to the MRI device, and means for selectively coupling the MRI simulator to the proper portion of the MRI device. For example, in a preferred embodiment, means for providing digital data representative of the previously imaged object can be a memory for storing the digital data, having an output which can be selectively coupled to the digital data processor of the MRI device. The means for providing analog data can be a digital-to-analog ("D/A") converter, which can be selectively coupled to the memory to receive the digital data, and can also be selectively coupled to the analog-to-digital ("A/D") converter of the MRI device. The means for providing high frequency analog data can be a frequency up converter, which can be selectively coupled to the output of the D/A converter to receive the analog data, and to the frequency down converter of the MRI device. The frequency up converter can also be selectively coupled to the variable amplifier of the MRI device. The means for providing radio frequency data can be a transmitting coil selectively coupled to the output of the frequency up converter. The transmitting coil can be positioned proximate the receiving coil of the MRI device, to provide radio frequency data representative of the previously imaged object to the MRI device, independent of or during an actual scan. The apparatus of the present invention may comprise means for providing data representative of the previously imaged objects to fewer than the subsystems included in the preferred embodiment, as well.

DESCRIPTION OF THE INVENTION

Figure 1:
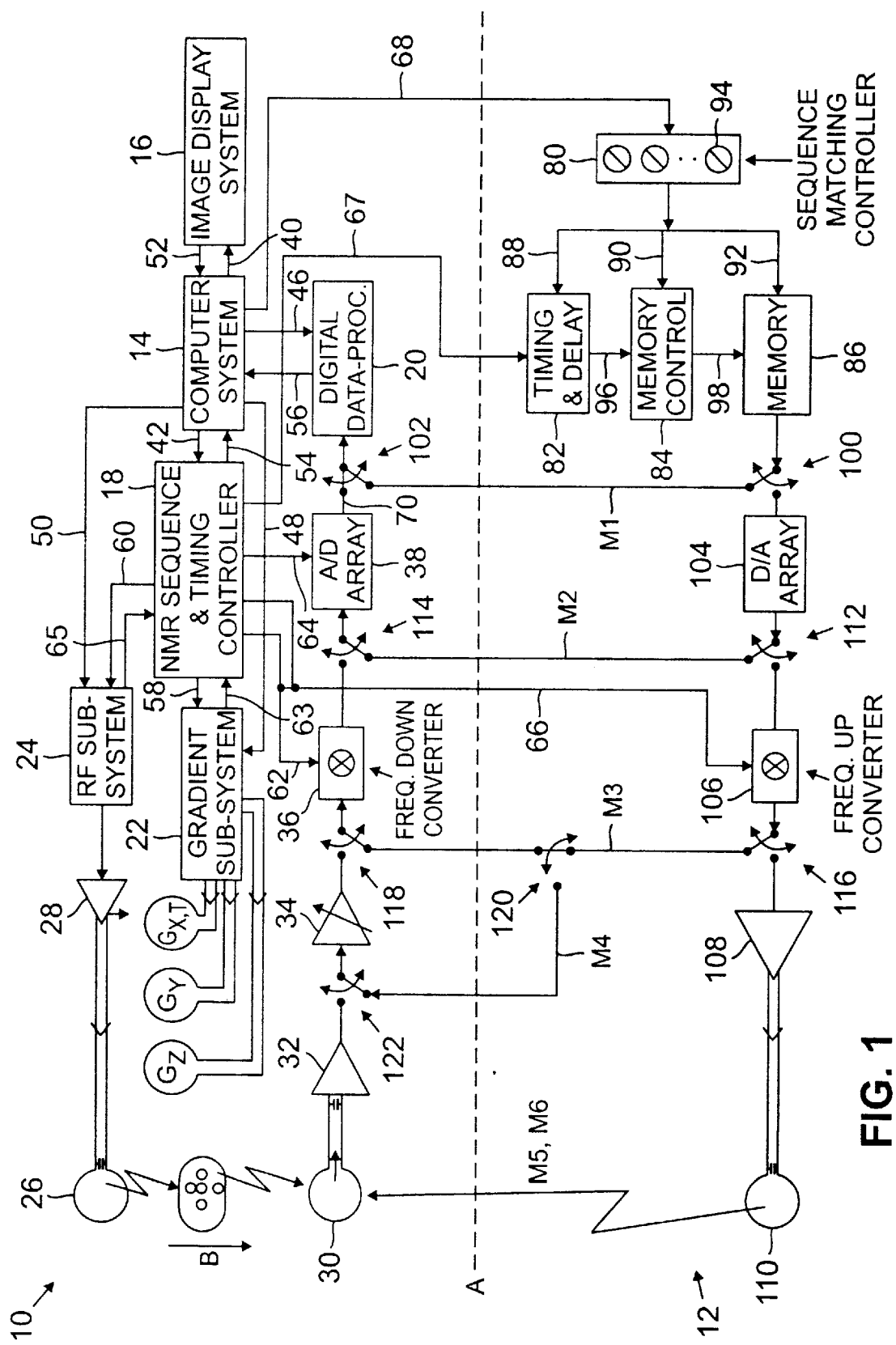
FIG. 1 is a schematic diagram of an MRI simulator of the present invention, coupled to a typical magnetic resonance imaging device.

FIG. 1 is a schematic diagram of the major subsystems of a typical magnetic resonance imaging ("MRI") system 10, shown above a dotted line A, coupled to a preferred embodiment of an MRI simulator 12 of the present invention, located below the dotted line A. The MRI simulator 12 can be a portable unit which is connected to the MRI device 10 prior to conducting a diagnostic procedure, or it can be an integral part of the MRI device.

A typical MRI system 10 has a computer 14, an image display system 16, a nuclear magnetic resonance sequence and timing controller ("NMR controller") 18 and a digital data processor 20. The system also includes a gradient subsystem 22, a radio frequency transmitter subsystem ("RF Subsystem") 24, and a magnet with an imaging volume (not shown). Magnetic shimming coils (not shown) are typically provided, as well. The magnet can be a permanent magnet, electromagnet or a superconducting magnet, as is known in the art. The RF subsystem 24 includes a transmitting coil 26 coupled to an amplifier 28. A receiving coil 30 is also provided, coupled to the digital data processor 20 through a pre-amplifier 32, a variable amplifier 34, a frequency divider or frequency down converter 36, and an analog-to-digital conversion array ("IA/D array") 38. The digital data processor 20 is typically coupled to the A/D array 38 through a data bus (not shown). The A/D array 38, frequency down converter 36, variable amplifier 34 and preamplifier 32 are typically connected to each other through cables. While two separate transmitting and receiving coils 26, 30 are shown, a single coil can both transmit an RF signal and receive magnetic resonance imaging data, as is known in the art.

The computer 14 has outputs connected to inputs of the image display system 16, NMR controller 18, digital data processor 20, gradient subsystem 22, and RF transmitter subsystem 24 by lines 40, 42, 46, 48 and 50, respectively. The computer also has inputs connected to outputs of the image display system 16, NMR controller 18, and digital data processor 20 by lines 52, 54 and 56, respectively. The NMR controller 18 also has inputs connected to outputs of the gradient subsystem 22 and RF subsystem 24 by lines 63 and 65, respectively.

The NMR controller 18 has outputs connected to inputs of the gradient subsystem 22 and RF subsystem 24 by lines 58 and 60, respectively. The NMR controller 18 also has outputs connected to inputs of the frequency down converter 36 and A/D array 38 by lines 62 and 64, respectively.

The computer 14 is a real time computer with sub-microsecond timing precision. The computer 14 controls the overall function of the MRI device 10.

The NMR controller 18 is a microprocessor based timing controller or other programmable device which stores the timing of an MRI sequence. A clock (not shown) in the NMR controller 18 synchronizes the entire MRI device 70. The NMR controller 18 acts as a "timing means" which controls the implementation of a scanning sequence by providing a synchronization pulse, indicating the start of a scanning procedure, and timing pulses for controlling the operation of the various subsystems, to the A/D Array 38, RF subsystem 24 and the gradient subsystem 22. For example, the NMR controller 18 provides a series of pulses to the A/D array 38 indicating when the A/D array 38 should sample the signal provided by the frequency down converter 36. The NMR controller 18 similarly provides a series of pulses to the RF transmitter subsystem 24 for initiating the injection of radio frequency pulses into the imaging volume. The NMR controller 18 similarly controls operation of the gradient subsystem 20.

The NMR controller 18 also typically comprises a frequency generator (not shown) which provides a reference frequency to the frequency down converter 36 of the MRI device 10. The NMR controller 18 may also comprise a second frequency generator, which could be used to provide a reference frequency to the MRI simulator 12 along line 66. If the NMR controller 18 comprises only one frequency generator, that one frequency generator could be used to control both the frequency down converter 36 of the MRI device 10 and the MRI simulator 10.

The gradient subsystem 22 is formed by gradient coils Gx, Gy, Gz for producing orthogonal linear magnetic fields within the imaging volume. The gradient subsystem 22 also has a gradient waveform generator (not shown), which contains a generic waveform stored in digital form and a phase encoding waveform. The NMR controller 18 controls the timing of the gradient waveform generator. In response to a pulse from the NMR controller, the gradient waveform generator outputs a particular waveform for a desired scanning sequence to each of the gradient coils Gx, Gy, Gz, as is known in the art and described in U.S. Pat. No. 4,871,966, assigned to the assignee of the present invention, for example. The disclosures of U.S. Pat. No. 4,871,966 are incorporated by reference, herein.

The A/D array 38 typically comprises an analog-to-digital converter, an amplifier and anti-aliasing low pass filter. Separate A/D arrays may be provided for the real and imaginary components of the analog signal provided by the amplifier.

During magnetic resonance imaging of a subject within the imaging volume of the MRI device, a desired gradient field is established and radio frequency signals are injected into the imaging volume in a desired sequence. Magnetic resonance imaging data signals are picked up from the subject by the receiver coil 30, amplified to an adequate level for further processing by the pre-amplifier 32, and further amplified by the amplifier 34. The frequency of the signals is decreased from the megahertz range to the kilohertz range by the frequency down converter 36. The A/D array 38 converts the analog signal into a digital signal.

The output of the A/D array 38 is provided to the input of the digital data processor 20 by line 70. The digital data processor 20 filters the data to remove noise signals outside the desired bandwidth and creates a two-dimensional array of numbers which are provided to the computer 14 along line 56. The computer 14 processes the data for display by the image display system 16.

The MRI simulator 12 in accordance with a preferred embodiment of the present invention will now be described. The MRI simulator 12 comprises a plurality of stages which can each be selectively coupled to a different subsystem of the MRI device 10 in different testing modes of the MRI simulator 12 to evaluate that subsystem and those downstream from it.

The MRI simulator 12 comprises a sequence matching controller 80, which has outputs connected to inputs of a timing delay block 82, a memory control block 84 and a memory block 86, by lines 88, 90 and 92. The data memory 86 can be one or more EPROMs, for example. The memory block 86 is coupled to a digital-to-analog array ("D/A array") 104, through a switch 100. The D/A array 104 is coupled to a frequency multiplier, such as a frequency up converter 106, through a switch 112. The frequency up converter 106 is coupled to an amplifier 108 which is coupled to a transmitting coil 110.

The sequence matching controller 80 is a programmable device. It may be a series of binary switches, such as a hex switch, or a microcontroller, for example. The sequence matching controller 80 has an optional input connected to an output of the computer 14 of the MRI device 10 by line 68. The MRI sequence or sequences to be used in the evaluation of the MRI device 10 is input by the computer 14 or manually set on the sequence matching controller 80 with dials 94 or through a keypad (not shown).

The timing and delay block 82 is a counter having an input for being connected to an output of the NMR controller 18 by the line 67. A 20 bit counter with a phase synchronized 8 $MH_z$ clock provides sufficient time delay and resolution for MRI applications. Generally, precise delays of from 5 milliseconds to 100 milliseconds are needed to match typical MRI scanning sequences. The 8 $MH_z$ clock is synchronized in phase with the signal from the NMR controller 18 along line 67. Other techniques for providing a delay, such as a one-shot multivibrator, may be used as well. The delays can also be included in the scanning sequence stored in the sequence matching controller. In that case, the NMR Controller 18 would be connected to the sequence matching controller 80 to provide synchronization pulses thereto.

The timing delay block 82 has an output connected to a second input of the memory control block 84 by a line 96.

The memory control block 84 has an output connected to a second input of the memory block 86 by a line 98. The memory control block 84 comprises a slice counter, a level counter and a sample counter (not shown), for selecting the data to be output at that point in time.

The synchronization pulses provided by the NMR controller 18 to the subsystems of the MRI device 10, as described above, is provided to the timing delay block 82 of the MRI simulator 12, to synchronize the operation of the simulator 12 with that of the MRI device 10. The timing and delay block 82 adjusts the delays in the simulator 12 to coincide with the delays of an actual scanning sequence. Data is thereby output from the memory block 86 at the proper starting point based on the synchronization signal from the NMR controller 18. The data is output at the proper rate based on the scanning sequence provided by the sequence matching controller 80. The output data corresponds to the actual image or portion of an image which would be obtained at that point in time for the particular simulated scanning sequence.

The data memory block 86 has an output which can be selectively coupled via the switch 100 to the digital data processor 20 of an MRI device, such as MRI device 10, to be evaluated. The data memory block 86 is connected to the digital data processor 20 through the data bus (not shown) connecting the digital data processor 20 to the A/D array 38. The connection is represented in the drawing by a switch 102.

The data memory block 86 is also selectively coupled to an input of the D/A array 104 of the simulator 12, through the switch 100. The D/A array 104 comprises a digital-to-analog converter, an amplifier, and an anti-aliasing low pass filter. Separate arrays are preferably provided for the real and imaginary components of the stored data representative of the scanned object.

The D/A array 104 has an output which is selectively coupled to the A/D array 38 of the MRI device 10 via the switch 112. The cable connecting the A/D array 38 to the frequency down converter 36 can be disconnected from the frequency down converter 36 and connected to the output of the switch 112. The connection is shown schematically in FIG. 1 as switch 114.

The D/A array 104 is selectively coupled to the frequency up converter 106 of the simulator 12 through the switch 112. The frequency up converter 106 is selectively coupled to the frequency down converter 36 of the MRI device 10, via the switch 116. The cable connecting the frequency down converter 36 to the variable amplifier 34 is connected to the output of the switch 116. The connection is shown schematically as switch 118.

The NMR controller 18 of the MRI device 10 has an output which can be coupled to an input of the frequency up converter 106 in the simulator 12. The frequency up converter 106 multiplies the frequency of the signal received from the D/A array 104 by a signal provided from the NMR controller 18 along line 66, to increase the frequency of the signal from the kilohertz to megahertz range. The signal provided by the frequency up converter 106 thereby corresponds to the frequency range of the magnetic resonance image data received by the frequency down converter 36 from the receiving coil 30. The frequency up converter 106 may be additionally selectively coupled to the variable amplifier 34 of the MRI device through switch 120, whose output is connected to the cable connecting the variable amplifier 34 to the preamplifier 32. The connection is shown schematically as switch 122.

The MRI transmitting coil 110 has an input selectively coupled to an output of the frequency up converter 106 through the amplifier 108 and the switch 116.

In normal operation of the MRI device 10, switches 102, 114, 118 and 122 are positioned such that the digital data processor 20, A/D array 38, frequency down converter 36 and variable amplifier 34 are connected to each other.

Operation of the MRI simulator 12 in accordance with the present invention will now be described. To set up the MRI simulator 12 for evaluation of an MRI device such as MRI device 10, scans of a phantom object or objects are conducted by an MRI device known to be operating properly. As is known in the art, a phantom object is a cubic, cylindrical or other shaped container containing a solution, such as nickel chloride, which yields a magnetic resonance signal. The detected magnetic resonance imaging signals are processed by the MRI device and displayed, as in an ordinary scan. The displayed image, referred to hereinafter as a "reference image", is stored on a storage medium such as a floppy disc or CD ROM, for example, by the computer of the MRI device. The raw digital data which has not been processed by the digital data processor 20, referred to hereinafter as "raw simulation data", is stored on a separate storage medium. Instead of a phantom object, a body part may also be used. Thus, the term "object" as used herein encompasses a phantom object or a body part.

The raw digital data is downloaded from the storage medium to a standard EPROM programmer for programming. The programmed EPROM or EPROMS are then inserted into the MRI simulator 12. The EPROMS correspond to the memory block 86 in the MRI simulator 12 of FIG. 1. Other types of memory can be used as well. For example, RAM with a battery back-up, flash memory or any other non-volatile memory could also be used.

If the MRI simulator 12 is a portable unit, it is connected to the MRI device 10 to be evaluated by connecting switches 100, 112, 116 and 120 of the simulator 12 to switches 102, 114, 118 and 122 of the MRI device 10. Preferably, all the switches are connected, but less than all can be connected for a limited evaluation of the MRI device 10, as well. The computer 14 may also be connected to the sequence matching controller along line 68. The NMR controller 18 is connected to the timing and delay block 18 along line 67 and to the frequency up converter 106 along line 66.

The MRI simulator 12 of the present invention has a first testing mode M1 for testing the integrity of the digital data processor 20, image display system 16 and the timing pulses of the NMR controller 18 of the MRI device 10. The data memory block 86 of the MRI simulator 12 is coupled to the digital data processor 20 of the MRI system 10 by properly setting switches 100 and 102, for example.

The MRI scanning sequence conducted on the phantom objects to obtain the raw simulation data is provided by the computer 14 of the MRI device 10 to the sequence matching controller 80, manually set by dials 94 on the controller 80, or manually input to the controller 80 through a keyboard. The NMR controller 18 in the preferred embodiment provides a synchronization pulse to the timing and delay block 82 of the MRI simulator 12 to indicate the start of the MRI sequence. It also provides subsequent pulses to the timing and delay block 82 corresponding to the pulses provided to the digital data processor 20 through the A/D Array 38, to synchronize the output of data from the data memory block 86 to the expected receiving time windows of the digital data processor 20. The timing of the MRI simulator 12 is thereby matched to that of the MRI device.

In response to the synchronization pulse of the NMR controller, the raw simulation data obtained from the scanned objects and stored in the data memory block 86 is provided from the memory block 86 to the digital data processor 20 of the MRI device, slice by slice, with the same timing as in an actual scan. The slice counter, level counter and sample counter, for example, of the memory control block 84 selects the data corresponding to the portion of a particular slice corresponding to the data which would be received by the digital data processor 20 at that point in time of the scan. The raw simulation data is processed by the digital data processor 20 as if it were being provided by the A/D array 38 of the MRI device 12 in an actual scan. The processed data is then output to the computer 14 and to the image display system 16. The reference image is also provided to the computer 14 through a modem or a storage medium. The computer 14 conducts a pixel by pixel comparison of the image data output by the digital data processor 20 with the reference image, which should be identical. Differences indicate a problem with the digital data processor 20, the computer 14, the synchronization pulse of the NMR controller 18 or the image display system 16.

The MRI simulator 12 of the present invention has a second testing mode M2 wherein the A/D array 38 is evaluated along with the digital data processor 20, the synchronization and timing pulses of the NMR controller 18 and the image display system 16. In the second mode M2, switch 100 of the MRI simulator 12 is set to connect the data memory block 86 to the D/A array 104, as shown in FIG. 1. The D/A array 104 of the simulator 12 is coupled to the A/D array 38 of the MRI device 10 by properly setting switches 112 and 114. In the MRI device 10, the digital data processor 20 is connected to the A/D array 38 through the switch 102, as shown in FIG. 1. Raw simulation data from the data memory block 86, which is in the form of a digital signal, is converted into an analog signal by the D/A array 104 of the MRI simulator 12 and provided to the A/D array 38 of the MRI system 10. The analog signal is converted into a digital signal by the A/D array 38 of the MRI device 10 in accordance with the control and timing signals provided by the NMR controller 18. The digital signal is then processed and displayed in the same manner as actual data from an MRI imaging procedure measurement would be processed and displayed. The displayed image is compared to the reference image, either visually or by the computer 14. If the image derived from the raw simulation data is not within acceptable tolerances of the reference image, there is a problem in the A/D array 138, digital data processor 20, NMR controller 18, or image display system 16. If the system has passed its first mode M1 evaluation, then the problem would be isolated to being within the A/D array 38 or the control and timing signals provided by the NMR controller 18. The image derived from the raw simulation data may not identically match the reference image because of noise in the amplifiers of the D/A array 104 and A/D array 38.

The MRI simulator 12 preferably has a third testing mode M3 for evaluating the frequency down converter 36 along with the portions of the MRI device 10 evaluated in the first and second modes M1, M2. The MRI simulator 12 is set up as in the second mode M2, except that the D/A array 104 is coupled to the frequency up converter 106 through the switch 112, and the frequency up converter 106 is coupled to the frequency down converter 36 of the MRI device 10 through switches 116 and 118. The frequency down converter 36 of the MRI device 10 is connected to the A/D array 38, which is connected to the digital data processor 20 by properly setting switches 114 and 102.

The analog signal provided by the D/A array 104 of the MRI simulator 12, derived from the raw simulation data, is provided to the frequency up converter 106 of the MRI simulator 12, which shifts the frequency of the signal from the kilohertz range to the megahertz range of actual detected magnetic resonance imaging data. The frequency down converter 36 of the MRI device 10 then shifts the signal back to the kilohertz range, as it would shift actual signals received from the coil 30 of the MRI device 10 in an actual scan. The signal is then processed and displayed as discussed above. Both the frequency up converter 106 of the MRI simulator 12 and the frequency down converter 36 of the MRI device 10 use a reference frequency provided by the NMR controller 18.

Image artifacts, such as banding, multiple images, or fuzziness in the image, referred to as ghosting, indicate that there is a problem somewhere in the frequency down converter 36 and the remainder of the system evaluated in the previous modes of the MRI simulator 12. If the previous test modes were conducted and passed, the problem would be isolated to being within the frequency down converter 36 or reference frequency and timing pulses provided by the NMR controller 18. Image artifacts can be detected visually or by the computer 14.

The MRI device 10 may use a high speed A/D converter in a high speed A/D array which can digitize the high frequency MRI data signals received from the patient. In that case, the MRI device 10 does not need a frequency down converter 36 and separate second and third testing modes would not be necessary. Data from the MRI simulator 12 would then be input in the second mode M2, from the frequency up converter 106 to the high speed A/D array.

Optionally, the output from the frequency up converter 106 of the simulator 12 is provided to the variable amplifier 34 of the MRI device 10 to evaluate its operation in a fourth testing mode M4. The cable between the input of the variable amplifier 34 and the output of the preamplifier 32 is disconnected from the preamplifier 32 and connected to the output of a switch 120. This connection is shown schematically as switch 122. The variable amplifier 34 is evaluated by positioning switches 116, 120 and 122 to connect the frequency up converter 106 of the MRI simulator 12 to the variable amplifier 34 of the MRI device 10. Image artifacts detected visually or by the computer 14 indicate a problem within the variable amplifier 34 and the remainder of the system evaluated in previous modes. If the previous modes were conducted and passed, the problem would be isolated to the variable amplifier.

The MRI simulator 12 of the present invention also preferably has a fifth testing mode M5 for evaluating the radio frequency receiver coil 30 and pre-amplifier 32. The MRI simulator 12 is set up as in the third mode M3, except that the switch 116 is set to connect the frequency up converter 106 to the amplifier 108. The output of the amplifier 108 is provided to the transmitting coil 110 of the MRI simulator 12, which is proximate the receiving coil 30 of the MRI device 10. An electromagnetic wave image corresponding to the raw simulation data is emitted by the transmitting coil 110. The signal is picked up by the receiving coil 30 and the signal is processed as in an actual scan.

As above, image artifacts in the displayed image, determined visually or by the computer 14, indicate a problem. If the earlier modes have been passed, the problem would be isolated to being within the receiving antenna 30 or the pre-amplifier 32.

The MRI simulator 12 also preferably comprises a sixth testing mode M6 for evaluating the gradient subsystem 20, the magnet, the magnetic field shimming coils, referred to collectively as the "magnetics", and the RF subsystem 24. The MRI simulator 12 is set up as in the fifth testing mode M5. An electromagnetic wave image corresponding to the raw simulation data of the phantom object is emitted from the transmitting coil 110 of the MRI simulator 12, as in the fifth mode, while an actual magnetic resonance image scan of a different phantom object is performed by the MRI device 10. The phantom object used in the actual scan is positioned such that when displayed, it will occupy a different portion of the screen than the image derived from the raw simulation data. The images are displayed concurrently by the image display system 16. Image artifacts appearing only in the image of the actual scanned object indicate that there is a problem in the magnetics, the RF subsystem 24, the transmitting coil 26, the amplifier 28, or the NMR controller 18. If there are image artifacts in both images, and the earlier testing modes have not been conducted, there could be a problem in the signal processing components between the receiving coil 30 and the image display 16, or the NMR controller 18. There could also be multiple problems, such as in both the magnetics and in the signal processing. The other testing modes should then be conducted to isolate the problem. As above, image artifacts can be detected visually or by the computer 14.

An MRI device 10 as shown in FIG. 1 could be adapted to be connected to the MRI simulator 12 more easily by providing actual switches at the positions of numerals 102, 114, 118 and 122. If the simulator 12 is integrated into the MRI device, automatic switches, such as relays, can be provided at 102, 114, 118 and 122.

In a thorough diagnostic evaluation, each of the testing modes of the MRI simulator 12 would preferably be conducted starting with mode M1. It is noted, however, that a quick evaluation of an MRI device can be provided by performing only mode M6. If mode M6 is passed, all the subsystems of the MRI device are operating properly. If mode M6 is not passed, then the other testing modes can be performed to isolate the problem.

Figure 2:
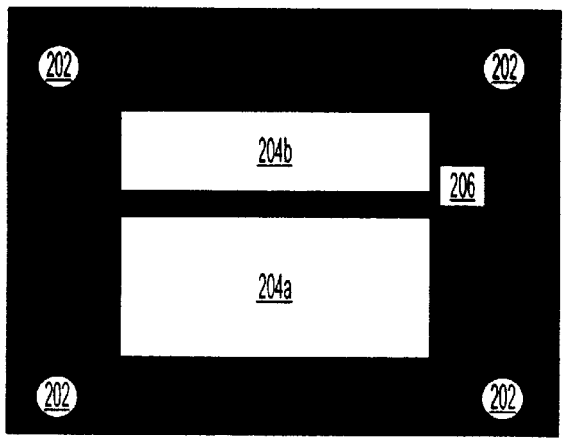
FIG. 2 is a representation of an image displayed during one of the testing modes of the simulator of the present invention.

FIG. 2 is a representation of an image displayed during the sixth testing mode M6 of the simulator 12. The four circles 202 at the four corners of the image are derived from the raw simulated data of four phantom cylinders or disks transmitted by the coil 110 of the MRI simulator 12. The central image is from an actual scan of a standard square phantom 204a, 204b and a side car 206. The side car 206 is a rectangular tube filled with a different solution than that in a square phantom 204a, 204b, which enables evaluation of the contrast resolution of the MRI device 10, as is known in the art. The square phantom 204a, 204b includes a diagonal piece of plastic which yields no magnetic resonance signal. The phantom is placed such that, in a horizontal image slice, the portion of the plastic in the slice appears as a horizontal region yielding no MRI signal. Sections 204a and 204b, therefore, appear to be separate. In FIG. 2, there are no image artifacts in either image, indicating that the MRI device is operating properly.

Figure 3:
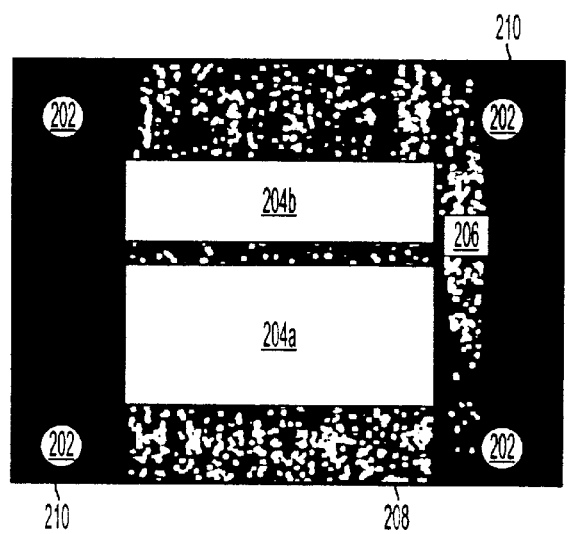
FIG. 3 is another representation of an image displayed during the same testing mode as in FIG. 2.

FIG. 3 is a representation of an image displayed during the sixth testing mode M6, where image artifacts 208 are shown schematically in the portion 208 of the image including the actual image, but there are no artifacts in the outer portion 210 of the image including the four circles 202, derived from the raw simulation data. This indicates a problem in the magnetics, the RF subsystem 24, the transmitting coil 26, the amplifier 28 or the NMR controller 18 of the MRI device 10. Problems in the magnetics could include magnetic field drift or magnetic field disturbances from external sources, such as subways, trains or elevators, as well as problems in any of the individual components of the magnetics. Since the image derived from the radio frequency signal transmitted from the MRI simulator 12 is clear, the problem is not associated with those components of the MRI device 10 involved in receiving and processing that signal, namely the receiver coil 30, preamplifier 32, variable amplifier 34, frequency down converter 36, A/D array 38, digital data processor 20, computer system 14 or image display system 16.

Figure 4:
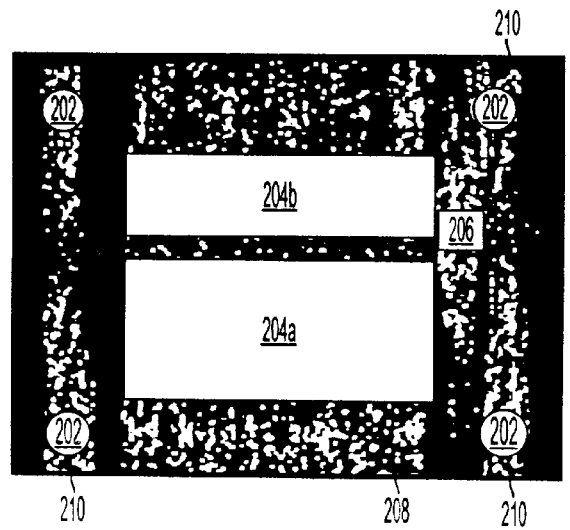
FIG. 4 is a representation of another image displayed during the same testing mode as in FIG. 2.

FIG. 4 is a representation of an image displayed during the sixth testing mode M6, wherein there are image artifacts in both the portion of the image from the actual scan 208 and in the portion of the image derived from the signal transmitted from the MRI simulator 210. The problem is probably in a portion of the MRI device 10 involved in receiving and processing data from both an actual scan and from the simulator 12, such as the receiver coil 30, preamplifier 32, variable amplifier 34, frequency down converter 36, A/D Array 38, digital data processor 20, computer system 14, image display system 16, and NMR controller 18, including the frequency synthesizers. The problem is probably not due to the magnetics, the RF subsystem or external disturbances, which would only interfere with the actual scan. However, there may be more than one problem, in which case the magnetics could be involved. Conducting the other testing modes would be required to isolate the problem or problems.

A blurred image of an object or an object appearing in several positions on the image in either the fifth or sixth testing modes M5, M6, could indicate a problem in the timing of the MRI device 10 causing reception of the magnetic resonance image data at different frequencies. Such a blurred image can indicate problems in the stability of the magnetics, the operation of the gradient or shim coils, the timing and precision of the scanning sequence, or the NMR controller 18.

Although the preferred embodiments of the present invention have been described and illustrated, it will be apparent to those skilled in the art that various modifications may be made without departing from the scope of the present invention, which is defined by the following claims.

We claim:

1. A magnetic resonance imaging simulator for evaluating a magnetic resonance imaging device having a digital data processing means, an analog-to-digital converting means coupled to the digital data processing means, and an image display means coupled to the digital data processing means, comprising:

first means for providing digital data representative of a previously imaged object to the digital data processing means;

means for selectively coupling the first means to the digital data processing means;

second means for providing analog data representative of the previously imaged object to the analog-to-digital converting means;

means for selectively coupling the second means to the analog-to-digital converting means; and means for selectively coupling the second means to the first means such that the digital data is provided to the second means for conversion into analog data.

2. The simulator of claim 1, wherein the magnetic resonance imaging device further has a frequency down converting means coupled to the analog-to-digital converting means, the simulator further comprising:

third means for providing high frequency analog data representative of the previously imaged object to the frequency down converting means;

means for selectively coupling the third means to the frequency down converting means; and means for selectively coupling the third means to the second means, such that the analog data is provided to the third means.

3. The simulator of claim 2, wherein the magnetic resonance imaging device further has a variable amplifier, the simulator further comprising:

fourth means for providing high frequency analog data representative of the previously imaged object to the variable frequency amplifier;

means for selectively coupling the fourth means to the variable frequency amplifier; and means for selectively coupling the fourth means to the third means, such that the analog data is provided to the fourth means.

4. The simulator of claim 3, wherein the third means and the fourth means are the same.

5. The simulator of claim 3, wherein the magnetic resonance imaging device further has a receiving coil coupled to the variable amplifier through a pre-amplifier, the simulator further comprising:

fifth means for providing high frequency radio frequency data representative of the previously imaged object to the receiving coil; and means for selectively coupling the fifth means to the third means, such that the high frequency analog data is provided to the fifth means.

6. The simulator of claim 5, wherein the magnetic resonance imaging device further has a magnet with an imaging volume, a gradient field generating means and a receiving coil, the simulator further comprising means for transmitting radio frequency data representative of the previously imaged object to the receiving coil while the magnetic resonance imaging device is conducting a scan of an object.

7. A simulator for evaluating a magnetic resonance imaging device, the simulator comprising:

a transmitting coil separate from a transmitting coil of the magnetic resonance imaging device; and first means for providing radio frequency data representative of a previously imaged object to the transmitting coil for transmission to a receiving coil of the magnetic resonance imaging device.

8. The simulator of claim 7, wherein the first means transmits radio frequency data representative of the previously imaged object to the receiving coil while the magnetic resonance imaging device conducts a scan of an object.

9. A magnetic resonance imaging simulator for evaluating a magnetic resonance imaging device having an analog-to-digital converting means, comprising:

first means for providing analog data representative of a previously imaged object to the analog-to-digital converting means; and means for selectively coupling the first means to the analog-to-digital converting means.

10. The simulator of claim 9, wherein the analog-to-digital converting means of the magnetic resonance imaging device is a high speed analog-to-digital converting means and the first means provides high frequency analog data.

11. A magnetic resonance imaging simulator for evaluating a magnetic resonance imaging device having a frequency down converter comprising:

first means for providing nigh frequency analog data representative of the previously imaged object to the frequency down converter; and means for selectively coupling the frequency down converter.

12. A magnetic resonance imaging simulator for evaluating a magnetic resonance imaging device having a variable frequency amplifier coupled to a receiving coil, the simulator further comprising:
   first means for providing high frequency analog data representative of the previously imaged object to the variable frequency amplifier; and
   means for selectively coupling the first means to the variable frequency amplifier.

13. A magnetic resonance imaging simulator for evaluating a magnetic resonance imaging device, comprising:
   first means for storing data representative of a previously imaged object;
   second means for outputting the data from the first means, in coordination with a predetermined scanning sequence; and
   third means for providing the output data to the magnetic resonance imaging device in coordination with the predetermined scanning sequence.

14. The simulator of claim 13, wherein the magnetic resonance imaging device comprises timing means for controlling the implementation of a scanning sequence, the timing means being coupled to the second means, the second means comprising means for storing the predetermined scanning sequence such that the second means outputs data under the control of the timing means.

15. The magnetic resonance imaging simulator of claim 14, wherein the magnetic resonance imaging device comprises a digital data processor and the third means of the simulator comprises a selective coupling between the storage means and the digital data processor of the magnetic resonance imaging device, for providing digital data representative of the previously imaged object to the digital data processor.

16. The simulator of claim 15, wherein the magnetic resonance imaging device comprises an analog-to-digital converting array coupled to the digital data processor and the third means of the simulator comprises a digital-to-analog converter coupled to the storing means for converting the digital data output by the storing means into analog signals and means for selectively coupling an output of the analog-to-digital converter to an input of the analog-to-digital converting array of the magnetic resonance imaging device.

17. The simulator of claim 16, wherein the magnetic resonance imaging device further comprises a frequency down converter coupled to the analog-to-digital converting array and the third means comprises a frequency up converter for converting the analog signals into high frequency analog signals and means for selectively coupling the frequency up converter to the output of the analog-to-digital converter, such that the analog signals are provided to the frequency up converter, and means for selectively coupling the frequency up converter to the frequency down converter of the magnetic resonance imaging device.

18. The simulator of claim 17, wherein the magnetic resonance imaging device comprises a receiving coil and the third means further comprises a transmitting coil and means for selectively coupling the transmitting coil to the frequency up converter, such that the high frequency analog signals are provided to the transmitting coil, which emits radio frequency signals corresponding to the high frequency analog signals.

19. The simulator of claim 18, wherein the third means further comprises means for transmitting radio frequency signals while the magnetic resonance imaging device is conducting a magnetic resonance imaging scan.

20. The simulator of claim 14, wherein the first means further comprises a transmitting coil and means for selectively coupling the transmitting coil to the first means such that radio frequency signals corresponding to the previously imaged object are transmitted by the radio frequency signals to a receiving coil of the magnetic resonance imaging device.

21. A diagnostic method for evaluating a magnetic resonance imaging device which conducts digital data processing, analog-to-digital conversion and image display, the method comprising:
   (a) providing analog data representative of a previously imaged object to an analog-to-digital converting array of the device for processing; and
   (b) evaluating the magnetic resonance imaging device based on its processing of the provided data.

22. The diagnostic method of claim 21, further comprising:
   (c) providing digital data representative of a previously imaged object to a digital data processor of the magnetic resonance imaging device for digital data processing; and
   (d) evaluating the magnetic resonance imaging device based on the processing of the digital data.

23. The diagnostic method of claim 22, wherein step (d) further comprises comparing the data processed by the digital data processor to previously processed data for differences.

24. The diagnostic method of claim 22, wherein step (a) further comprises providing the analog data to an analog-to-digital converting array of the magnetic resonance imaging device and step (d) further comprises comparing an image derived from the converted data to an image derived from previously processed data for differences.

25. The diagnostic method of claim 24, wherein the magnetic resonance imaging device further has a receiving coil, the method further comprising:
   (e) providing radio frequency data representative of the previously imaged object to the receiving coil; and
   (f) evaluating the magnetic resonance imaging device based on its processing of the data provided in step (e).

26. The diagnostic method of claim 25, wherein step (d) further comprises viewing an image derived from the radio frequency data for image artifacts.

27. The diagnostic method of claim 25, further comprising:
   (g) deriving an image from the data provided by the diagnostic device;
   (h) conducting a magnetic resonance imaging scan of an object;
   (i) deriving an image from the imaging scan; and
   (j) comparing the image derived in step (g) to the image derived in step (i).

28. The diagnostic method of claim 27, wherein steps (e) and (h) are conducted simultaneously.

29. The diagnostic method of claim 21, wherein the magnetic resonance imaging device further includes a frequency down converter, the method further comprising:
   (c) providing high frequency analog data representative of the previously imaged object to the magnetic resonance imaging device; and
   (d) evaluating the magnetic resonance imaging device based on its processing of the data provided in step (c).

30. The diagnostic method of claim 29, further comprising providing digital data representative of the previously imaged object to the magnetic resonance imaging device.

31. The method of claim 29, wherein step (c) further comprises providing high frequency analog data to a frequency down converter of the magnetic resonance imaging device and step (d) further comprises viewing an image derived from said high frequency analog data by the magnetic resonance imaging device, for image artifacts.

32. The diagnostic method of claim 31, wherein the magnetic resonance imaging device has a variable amplifier, the method further comprising:
(e) providing high frequency analog data representative of the previously imaged object to the variable frequency amplifier; and
(f) evaluating the magnetic resonance imaging device based on its processing of the data provided in step (e).

33. The diagnostic method of claim 32, further comprising providing digital data representative of the previously imaged object to the magnetic resonance imaging device.

34. The diagnostic method of claim 21, wherein the magnetic resonance imaging device further has a receiving coil, the method further comprising:
(c) providing radio frequency data representative of the previously imaged object to the receiving coil; and
(d) evaluating the magnetic resonance imaging device based on its processing of the data provided in step (c).

35. The diagnostic method of claim 34, further comprising:
(e) conducting a magnetic resonance imaging scan of an object; and
(f) evaluating the magnetic resonance imaging device by comparing an image derived from the imaging scan by the magnetic resonance imaging device with an image derived by the magnetic resonance imaging device from the data provided by the diagnostic device.

36. The diagnostic method of claim 35, wherein steps (c) and (e) are conducted simultaneously.

37. The diagnostic method of claim 21, wherein step (a) comprises providing high speed analog data representative of the previously imaged object to the analog-to-digital converting array.

38. A diagnostic method for evaluating a magnetic resonance imaging device with a diagnostic apparatus, the method comprising:
(a) selectively coupling the diagnostic apparatus to a first signal processing component of the magnetic resonance imaging device, the signal processing component processing data in a first format;
(b) providing data representative of a previously imaged object in the first format to the first signal processing component of the magnetic resonance imaging device;
(c) evaluating the magnetic resonance imaging device based on its processing of the provided data;
(d) selectively coupling the diagnostic device to a second signal processing component of the magnetic resonance imaging device, the second signal processing component processing data in a second format;
(e) providing data representative of the previously imaged object in the second format to the second component; and
(f) evaluating the magnetic resonance imaging device based on its processing of the provided data.

39. A diagnostic method for evaluating a magnetic resonance imaging device with a diagnostic apparatus, the method comprising:
(a) storing data representative of a previously imaged object;
(b) outputting the data from storage, in coordination with a predetermined scanning sequence;
(c) providing the output data to the magnetic resonance imaging device in coordination with the predetermined scanning sequence; and
(d) evaluating the magnetic resonance imaging device based on its processing of the provided data.

40. The diagnostic method of claim 39, wherein the output data is digital data, the method further comprising providing the output to a digital data processor of the magnetic resonance imaging device.

41. The diagnostic method of claim 39, further comprising converting the output data into analog data prior to step (c), wherein step (c) further comprises providing the analog data to an analog-to-digital converter in the magnetic resonance imaging device.

42. The diagnostic method of claim 39, further comprising converting the output data into high frequency analog data prior to step (c), wherein step (c) further comprises providing the high frequency analog data to a frequency down converter of the magnetic resonance imaging device.

43. The diagnostic method of claim 39, further comprising converting the output data into high frequency analog data prior to step (c), wherein step (c) further comprises providing the high frequency analog data to a variable amplifier in the magnetic resonance imaging device.

44. The diagnostic method of claim 39, further comprising converting the output data into high frequency analog data prior to step (c), wherein step (c) further comprises providing the high frequency analog data to a high speed analog-to-digital converter of the magnetic resonance imaging device.

45. The diagnostic method of claim 39, further comprising converting the output data into radio frequency signals prior to step (c), and wherein step (c) further comprises providing the radio frequency signals to a receiving coil of the magnetic resonance imaging device.

46. The diagnostic method of claim 45, further comprising conducting a magnetic resonance imaging scan of an object concurrently with step (c), wherein step (d) comprises deriving a magnetic resonance image from the provided data and the magnetic resonance imaging scan and comparing the images.

47. A diagnostic method for evaluating a magnetic resonance imaging device comprising:
(a) providing radio frequency data representative of a previously imaged object to a receiving coil of a magnetic resonance imaging device for processing;
(b) evaluating the magnetic resonance imaging device based on the processing of the data provided.

48. The diagnostic method of claim 47, wherein step (b) comprises viewing an image derived by the magnetic resonance imaging device from the data provided in step (a).

49. The diagnostic method of claim 47, further comprising:
conducting a magnetic resonance imaging scan of an object prior to step (b), wherein step (b) comprises evaluating the magnetic resonance imaging device by comparing the processed data in step (a) with the data derived from the magnetic resonance imaging scan.

50. The diagnostic method of claim 49, wherein the magnetic resonance imaging scan is conducted simultaneously with step (a).

51. The diagnostic method of claim 50, further comprising:

(c) deriving an image from the data provided by the diagnostic device in step (a);

(d) deriving an image from the magnetic resonance imaging scan; and (e) comparing the image from step (c) to the image of step (d).

52. The diagnostic method of claim 51, wherein the images are superimposed and the imaging step comprises positioning the scanned object in an imagine volume of the magnetic resonance imaging device such that it appears in a different portion of the superimposed image than the image of the previously imaged object.

53. A diagnostic method for evaluating a magnetic resonance imaging device, comprising:

(a) providing high frequency analog data representative of a previously imaged object to a frequency down converter of the magnetic resonance imaging device for processing; and (b) evaluating the magnetic resonance imaging device based on the processed data.

54. A diagnostic method for evaluating a magnetic resonance imaging device, comprising:

(a) providing high frequency analog data representative of a previously imaged object to a variable amplifier of the magnetic resonance imaging device for processing; and (b) evaluating the magnetic resonance imaging device based on the processed data.

* * * * *

UNITED STATES PATENT AND TRADEMARK OFFICE
CERTIFICATE OF CORRECTION

PATENT NO.   : 6,025,717
DATED         : February 15, 2000
INVENTOR(S) : Hertz et al.

It is certified that error appears in the above-identified patent and that said Letters Patent is hereby corrected as shown below:

Column 3,
Line 60, change "electromagnent" to -- electromagnet --;

Column 12, claim 11,
Line 65, change "nigh" to -- high --;
Line 4, change "nigh" to -- high --;

Column 14, claim 20,
Line 3, change "first" to -- third --;
Line 1, change "first" to -- third --;

Column 15, claim 31,
Line 5, change "a" to -- the --; and
Line 2, change change "a" to -- the --; and Column 17, claim 52,
Line 9, change "imagine" to -- imaging --.
Line 3, change "imagine" to -- imaging --.

Signed and Sealed this

Fourth Day of December, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO.   : 6,025,717
DATED        : February 15, 2000
INVENTOR(S)  : Hertz et al.

It is certified that error appears in the above-identified patent and that said Letters Patent is hereby corrected as shown below:

Column 3,
Line 60, change "electromagnent" to -- electromagnet --;

Column 12,
Line 65, change "nigh" to -- high --;

Column 14,
Line 3, change "first" to -- third --;

Column 15,
Line 5, change "a" to -- the --; and

Column 17,
Line 9, change "imagine" to -- imaging --.

This certificate supersedes Certificate of Correction issued December 4, 2001.

Signed and Sealed this

Sixteenth Day of April, 2002

*Attest:*

JAMES E. ROGAN
*Director of the United States Patent and Trademark Office*

*Attesting Officer*